United States Patent
Agarwal et al.

(10) Patent No.: US 8,704,686 B1
(45) Date of Patent: Apr. 22, 2014

(54) HIGH BANDWIDTH COMPRESSION TO ENCODED DATA STREAMS

(71) Applicant: International Business Machines Corporation, Armonk, NY (US)

(72) Inventors: Kanak B. Agarwal, Austin, TX (US); H. Peter Hofstee, Austin, TX (US); Damir A. Jamsek, Austin, TX (US); Andrew K. Martin, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/733,354

(22) Filed: Jan. 3, 2013

(51) Int. Cl.
*H03M 7/34* (2006.01)
*H02M 7/38* (2006.01)

(52) U.S. Cl.
USPC .................... 341/51; 341/50; 341/65; 341/67

(58) Field of Classification Search
USPC .......................................... 341/50, 51, 65, 67
See application file for complete search history.

(56) References Cited

U.S. PATENT DOCUMENTS

| | | | |
|---|---|---|---|
| 5,281,967 A | | 1/1994 | Jung |
| 5,406,278 A | | 4/1995 | Graybill et al. |
| 5,406,279 A | * | 4/1995 | Anderson et al. ............... 341/51 |
| 5,467,087 A | * | 11/1995 | Chu ................................. 341/51 |
| 5,572,206 A | * | 11/1996 | Miller et al. .................... 341/51 |
| 6,624,762 B1 | | 9/2003 | End, III |
| 6,961,009 B2 | | 11/2005 | McCanne et al. |
| 7,051,126 B1 | | 5/2006 | Franklin |
| 7,307,552 B2 | | 12/2007 | Ma et al. |
| 7,538,695 B2 | | 5/2009 | Laker et al. |
| 2006/0261988 A1 | | 11/2006 | Hirose |

* cited by examiner

*Primary Examiner* — Khai M Nguyen
(74) *Attorney, Agent, or Firm* — Stephen R. Tkacs; Stephen J. Walder, Jr.; Libby Z. Toub

(57) ABSTRACT

A mechanism is provided in a data processing system for pipelined compression of multi-byte frames. The mechanism combines a current cycle of data in an input data stream with at least a portion of a next cycle of data in the input data stream to form a frame of data. The mechanism identifies a plurality of matches in a plurality of dictionary memories. Each match matches a portion of a given substring in the frame of data. The mechanism identifies a subset of matches from the plurality of matches that provides a best coverage of the current cycle of data. The mechanism encodes the frame of data into an encoded output data stream.

32 Claims, 5 Drawing Sheets

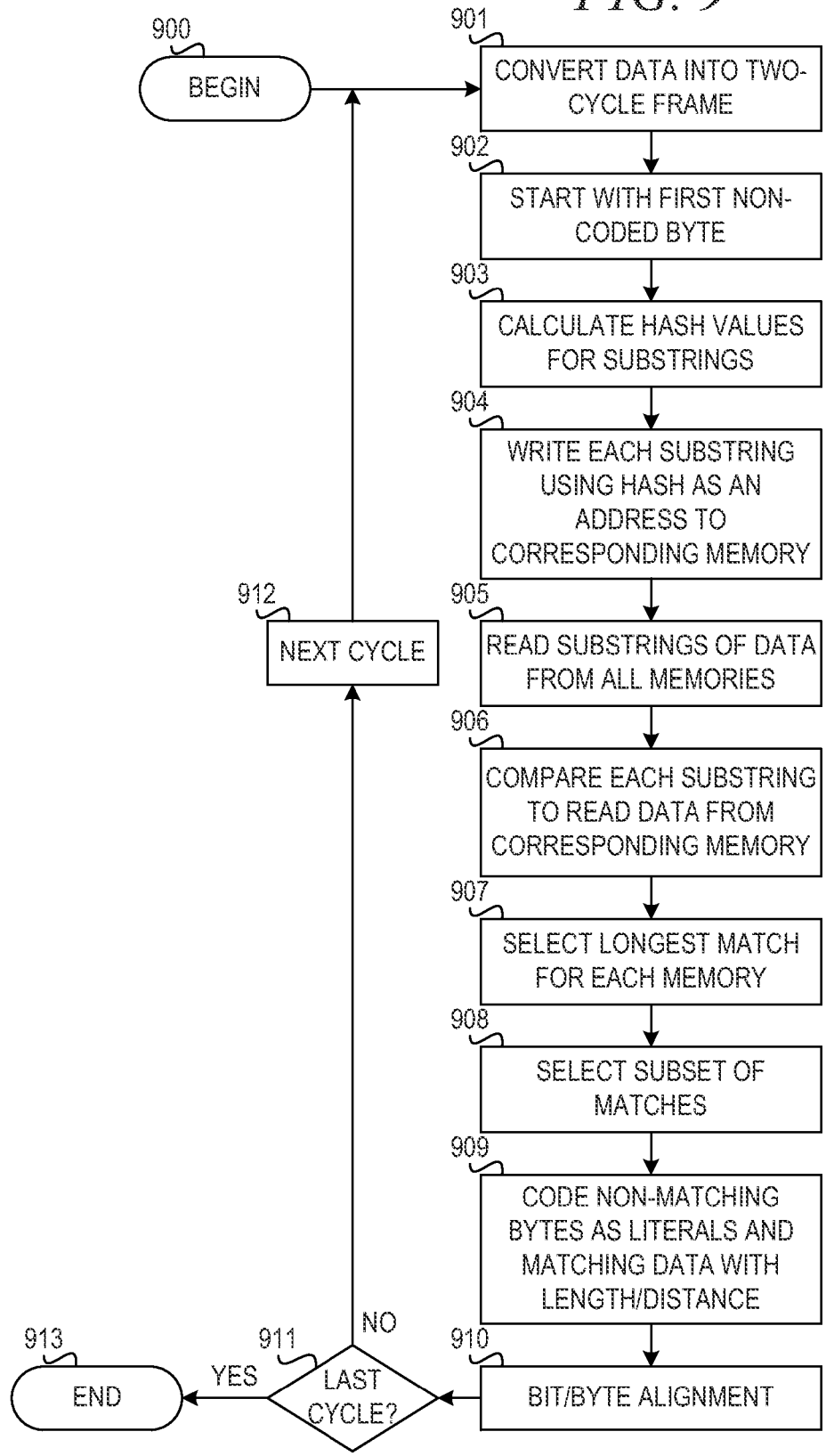

HIGH BANDWIDTH COMPRESSION TO ENCODED DATA STREAMS

BACKGROUND

The present application relates generally to an improved data processing apparatus and method and more specifically to mechanisms for high bandwidth compression to encoded data streams.

Deflate is a lossless data compression algorithm that uses a combination of the LZ77 algorithm and Huffman coding. LZ77 algorithms achieve compression by replacing repeated occurrences of data with references to a single copy of that data existing earlier in the input (uncompressed) data stream. A match is encoded by a pair of numbers called a length-distance pair, which is equivalent to the statement "each of the next length characters is equal to the characters exactly distance characters behind it in the uncompressed stream." The "distance" is sometimes called the "offset" instead.

Huffman coding is an entropy encoding algorithm used for lossless data compression. The term refers to the use of a variable-length code table for encoding a source symbol where the variable-length code table has been derived in a particular way based on the estimated probability of occurrence for each possible value of the source symbol.

Within compressed blocks, if a duplicate series of bytes is spotted (a repeated string), then a back-reference is inserted, linking to the previous location of that identical string instead. An encoded match to an earlier string consists of a length (3-258 bytes) and a distance (1-32,768 bytes). Relative back-references can be made across any number of blocks, as long as the distance appears within the last 32 kB of uncompressed data decoded (termed the sliding window).

The second compression stage consists of replacing commonly used symbols with shorter representations and less commonly used symbols with longer representations. Huffman coding creates an un-prefixed tree of non-overlapping intervals, where the length of each sequence is inversely proportional to the probability of that symbol needing to be encoded. The more likely a symbol has to be encoded, the shorter its bit-sequence will be.

SUMMARY

In one illustrative embodiment, a method, in a data processing system, for pipelined compression of multi-byte frames comprises combining a current cycle of data in an input data stream with at least a portion of a next cycle of data in the input data stream to form a frame of data. The method further comprises identifying a plurality of matches in a plurality of dictionary memories. Each match matches a portion of a given substring in the frame of data. The method further comprises identifying a subset of matches from the plurality of matches that provides a best coverage of the current cycle of data. The method further comprises encoding the frame of data into an encoded output data stream.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The apparatus for high bandwidth compression to an encoded data stream, the apparatus comprises a dictionary lookup/update stage comprising a plurality of dictionary memories and associated logic, a match selection stage comprising a plurality of compare circuits and associated logic, and an encoding stage. The dictionary lookup/update stage receives a frame of data comprising a current cycle of data in an input data stream combined with at least a portion of a next cycle of data in the input data stream and identifies a plurality of matches in the plurality of dictionary memories. Each match matches a portion of a given substring in the plurality of substrings. The match selection stage identifies a subset of matches from the plurality of matches that provides a best coverage of the current cycle of data using the plurality of compare circuits. The encoding stage encodes the frame of data into an encoded output data stream.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof will best be understood by reference to the following detailed description of illustrative embodiments when read in conjunction with the accompanying drawings, wherein:

FIG. 9 is a flowchart illustrating operation of a mechanism for high bandwidth compression to encoded data stream in accordance with an illustrative embodiment.

DETAILED DESCRIPTION

The illustrative embodiments provide a mechanism for processing a data stream in continuous cycles resulting in low latency and high throughput. The organization of the dictionary in arrays, one for each byte offset in a cycle of data. Several stages require a result to be immediately available for the next cycle for use in the same stage.

Figure 1:
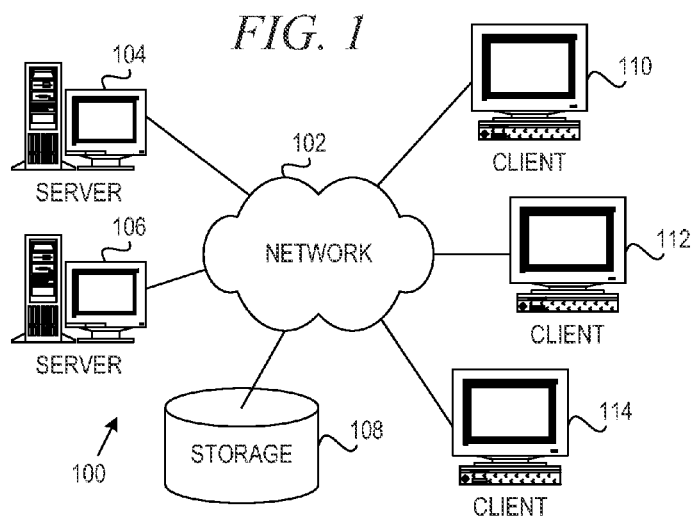
FIG. 1 depicts a pictorial representation of an example distributed data processing system in which aspects of the illustrative embodiments may be implemented.
Figure 2:
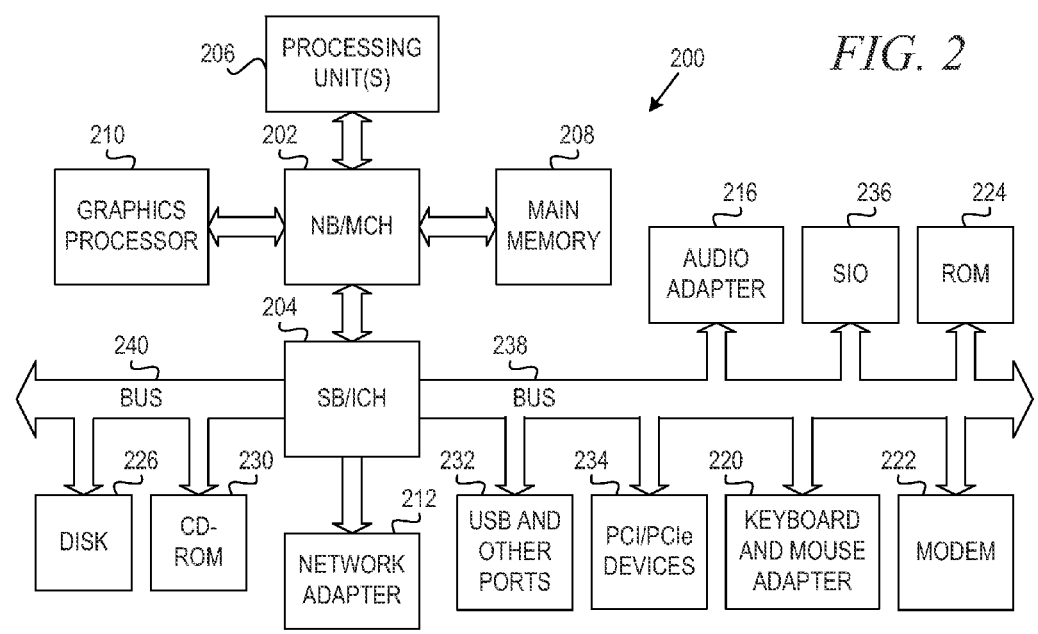
FIG. 2 is a block diagram of an example data processing system in which aspects of the illustrative embodiments may be implemented.

The illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram of an example data processing system in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 200 (Java is a trademark of Oracle and/or its affiliates).

As a server, data processing system 200 may be, for example, an IBM® eServer™ System P® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

Data processing system 200 may require data compression for various reasons. For example, data processing system 200 may compress data being stored to disk 226 or may compress data being transmitted over network adapter 212.

Figure 3:
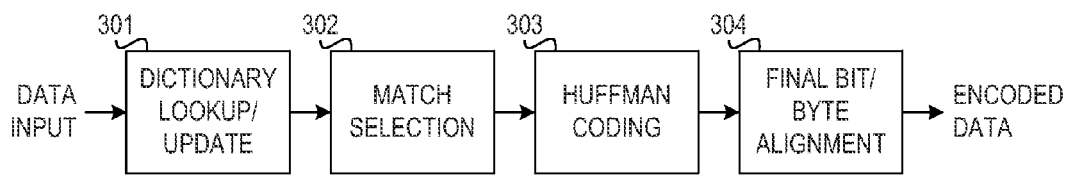
FIG. 3 is a block diagram illustrating a mechanism for processing an arbitrary stream of bytes of arbitrary length and outputs a stream of bytes in a compressed data format in accordance with an illustrative embodiment.

FIG. 3 is a block diagram illustrating a mechanism for processing an arbitrary stream of bytes of arbitrary length and outputs a stream of bytes in a compressed data format in accordance with an illustrative embodiment. The mechanism continuously consumes N bytes from the input stream every cycle and produces an encoded output stream. The mechanism consists of four phases: dictionary lookup/update 301, match selection 302, Huffman encoding 303, and final bit/byte alignment 304.

Figure 4:
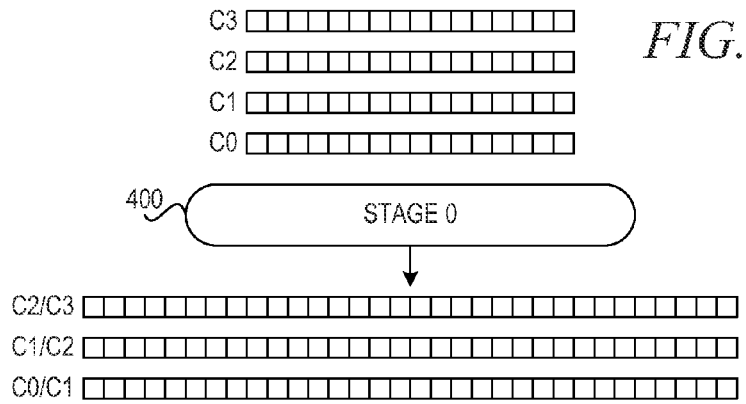
FIG. 4 depicts a conversion phase for converting an input data stream into two-cycle frames of data in accordance with an illustrative embodiment.

FIG. 4 depicts a conversion phase for converting an input data stream into two-cycle frames of data in accordance with an illustrative embodiment. Stage 0 400 receives N-byte cycles C0, C1, C2, C3. The stage 0 conversion mechanism 400 converts the input stream into two-cycle frames C0/C1, C1/C2, C2/C3.

Figure 5:
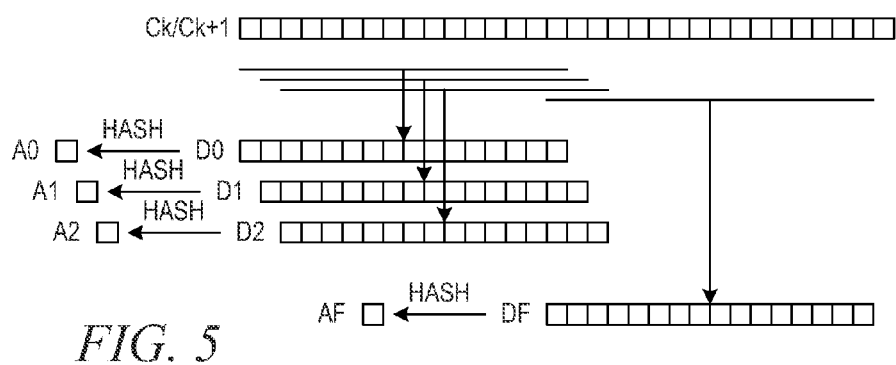
FIG. 5 depicts generating addresses for dictionary lookup/update in accordance with an illustrative embodiment.

FIG. 5 depicts generating addresses for dictionary lookup/update in accordance with an illustrative embodiment. In the dictionary lookup/update phase, for every cycle, the mechanism examines two consecutive cycles worth of data, that is, 2N−1 bytes. The mechanism considers every N-byte substring of bytes starting at each of the N bytes of the first cycle of data resulting in substrings, except the first one, that cross the cycle boundary. Thus, for input frame Ck/Ck+1, the mechanism considers substrings D0-DF. The mechanism performs a hash on each substring to generate addresses A0-AF. (For ease of notation, F=N−1.)

Figure 6:
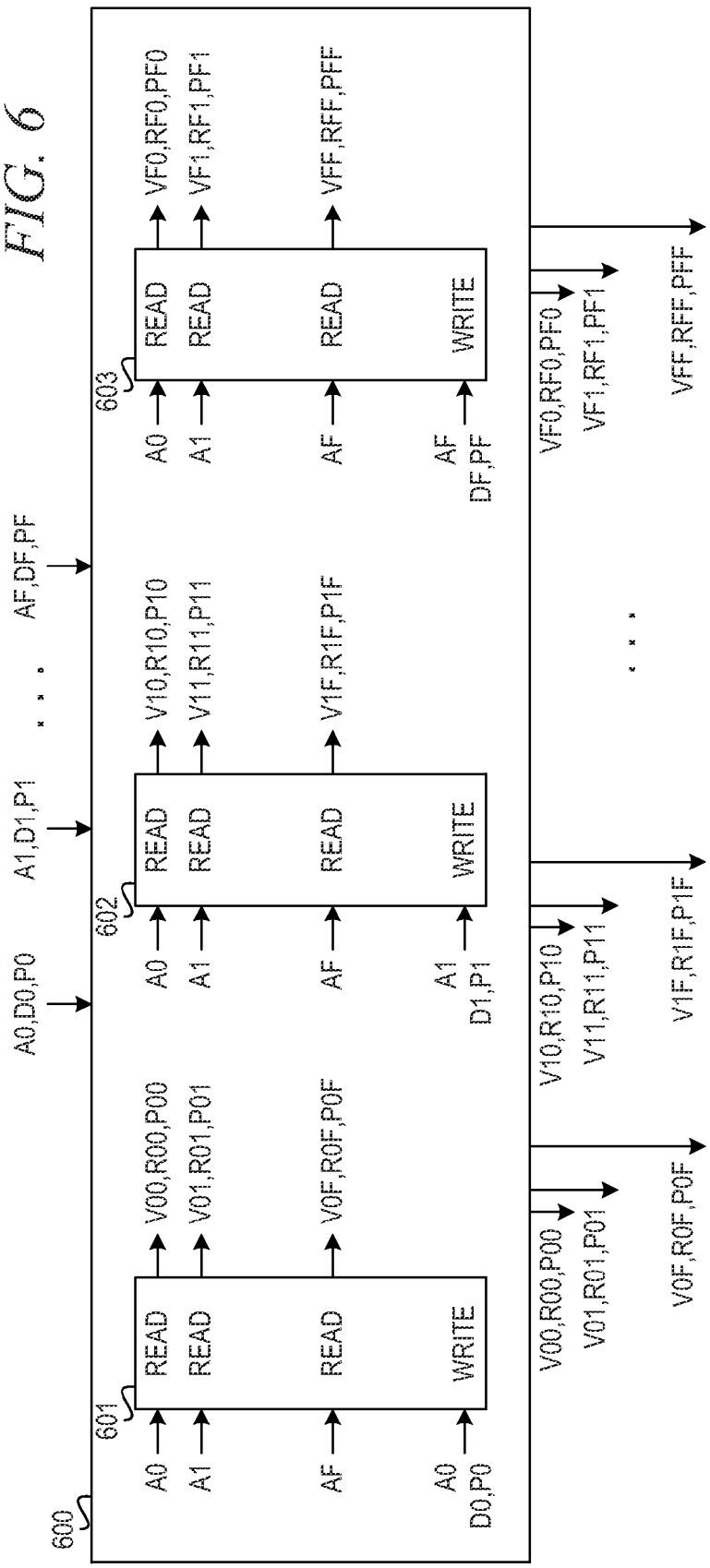
FIG. 6 depicts a dictionary lookup/update phase in accordance with an illustrative embodiment.

FIG. 6 depicts a dictionary lookup/update phase in accordance with an illustrative embodiment. For each of the N-byte offset positions, the stage 1 dictionary look-up/update mechanism 600 maintains an N-read, 1-write dictionary memory 601, 602, 603. The mechanism looks up each of the N-byte substrings in each of the N memories using addresses A0-AF, returning up to $N^2$ matches with previously seen data and the previous position in the byte stream. Dictionary lookup/update mechanism 600 updates each of the dictionary memories 601, 602, 603 with its N-byte substring to record the substrings having occurred in the byte stream along with the position in the byte stream for later matching.

Thus, dictionary lookup/update mechanism 600 receives an address A0-AF, data D0-DF, and position P0-PF for each substring from FIG. 5. The address A0-AF is the hash of the data D0-DF. Position P0-PF is the position in the byte stream. Given a frame of Ck/Ck+1, Pi=(position of Ck)+i, where each Pi is the position value for an $i^{th}$ substring, where i=0 to F. Each dictionary memory 601, 602, 603 writes to a respective address the data and position. Thus, dictionary memory 601 writes data D0 and position P0 at address A0, dictionary memory 602 writes data D1 and position P1 at address A1, and dictionary 603 writes data DF and position PF at address AF.

Each dictionary memory 601, 602, 603 performs N reads at addresses A0-AF. The read of memory 601 at A0 results in valid bit V00, read data R00, position value P00. The read of memory 601 at A1 results in valid bit V01, read data R01, position value P01. The read of memory 601 at AF results in valid bit V0F, read data R0F, position value P0F.

The read of memory 602 at A0 results in valid bit V10, read data R10, position value P10. The read of memory 611 at A1 results in valid bit V11, read data R11, position value P11. The read of memory 601 at AF results in valid bit V1F, read data R1F, position value P1F.

The read of memory 603 at A0 results in valid bit VF0, read data RFU position value PF0. The read of memory 601 at A1 results in valid bit VF1, read data RF1 position value PF1. The read of memory 601 at AF results in valid bit VFF, read data RFF, position value PFF.

Thus, for each cycle, the lookup/update phase results in N writes and $N^2$ reads (N reads for each of N substrings). Initially, each entry in dictionary memories 601, 602, 603 is invalid. Each write to dictionary memories 601, 602, 603 asserts the valid bit. Thus, for a read at a given address, the valid bit indicates whether valid data has been previously written to the entry corresponding to the address.

Figure 7:
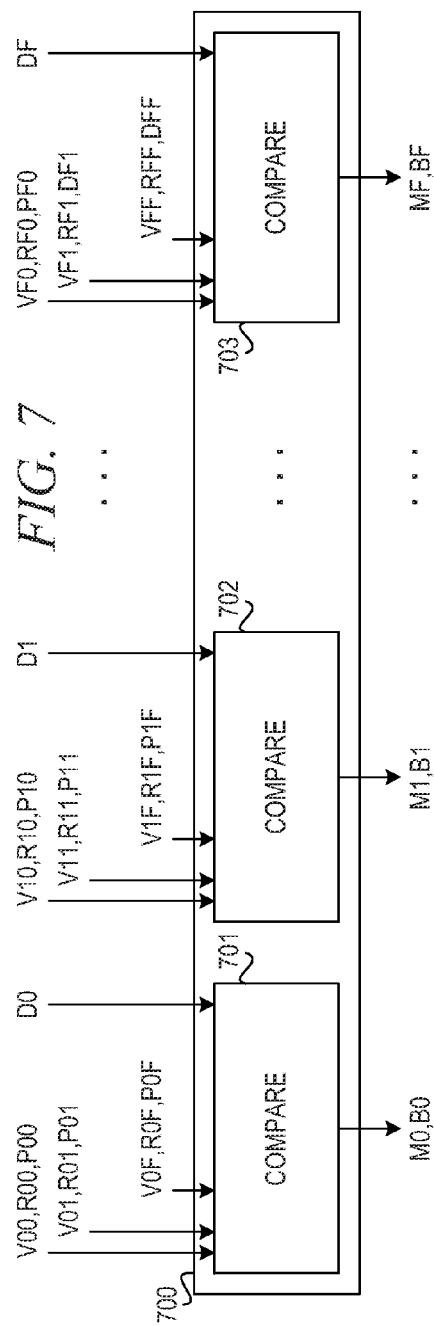
FIG. 7 is a block diagram illustrating a mechanism for match selection in accordance with an illustrative embodiment.

FIG. 7 is a block diagram illustrating a mechanism for match selection in accordance with an illustrative embodiment. Stage 2 match selection mechanism 700 comprises compare components 701, 702, 703. Match selection mechanism 700 receives N sets of read data from dictionary memories 601, 602, 603. For each set of read data, match selection mechanism 700 receives corresponding substring data D0-DF.

Each compare component 701, 702, 703 compares valid read data from dictionary memories 601, 602, 603 to the substring data D0-DF. For example, compare component 701 compares R00-R0F to substring data D0. For each R00-R0F, compare component 701 determines how many consecutive bytes match starting from the beginning of the substring. Compare component 701 then selects the read data R00-R0F with a longest match. Compare component 701 then outputs the longest match M0, if any, and the number of bytes that match B0.

Similarly, compare component 702 compares R10-R1F to substring data D1. For each R10-R1F, compare component 702 determines how many consecutive bytes match starting from the beginning of the substring. Compare component 702 then selects the read data R10-R1F with a longest match. Compare component 702 then outputs the longest match MF, if any, and the number of bytes that match B1.

Compare component 703 compares RF0-RFF to substring data DF. For each RF0-RFF, compare component 703 determines how many consecutive bytes match starting from the beginning of the substring. Compare component 703 then selects the read data RF0-RFF with a longest match. Compare component 703 then outputs the longest match MF, if any, and the number of bytes that match BF.

Figure 8:
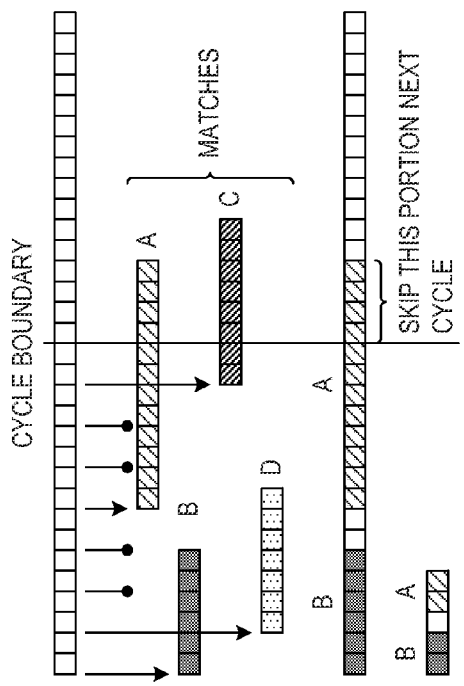
FIG. 8 illustrates match selection and alignment in accordance with an illustrative embodiment.

FIG. 8 illustrates match selection and alignment in accordance with an illustrative embodiment. Given some set of possibly overlapping matches A, B, C, D, the match selection and alignment phase must select the matches to maximize coverage of the data. As seen in the example shown in FIG. 8, matches B and D overlap, matches A and D) overlap, and matches A and C overlap. This leaves using matches A and B, B and C, or D and C. The mechanism of the illustrative embodiment selects the possible combinations of matches that cover the most of the original data.

As seen in FIG. 8, matches A and B provide the best coverage, leaving the fewest bytes unmatched. Because match A crosses the cycle boundary by four bytes, the first four substrings can be ignored in the next cycle.

Thus, the mechanism of the illustrative embodiment selects a longest match out of the N byte offset positions, among the N byte potential matches in that position, reducing the number of potential matches from as many as $N^2$ down to as many as N matches, one for each byte offset in the current cycle. The mechanism selects a subset of these matches to try to cover as many of the 2N−1 bytes as possible.

The mechanism first finds a match that crosses the cycle boundary and consumes as much of the current cycle as possible. The mechanism then finds additional matches to cover more bytes in the current cycle. The mechanism leaves enough information for the next cycle about bytes covered by the boundary crossing.

The match selection and alignment phase results in uncovered bytes and matched bytes. In on embodiment, the mechanism of the illustrative embodiment then performs Huffman coding on the uncovered bytes in the current cycle as literals. The mechanism of the illustrative embodiment codes the matches with length and distance.

Then, a bit/byte packing phase results in a sequence of bytes conforming to the deflate specification. First variable bit width codes in the current cycle are aligned by bit shifting operations resulting in a number of bytes with potentially a partial byte left over to be added to the next cycle's bits. The bytes in a cycle are accumulated until N bytes can be output in a single cycle.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 9 is a flowchart illustrating operation of a mechanism for high bandwidth compression to encoded data stream in accordance with an illustrative embodiment. Operation begins (block 900), and the mechanism converts a portion of the data stream into a two-cycle frame (block 901). The mechanism starts with the first non-coded byte (block 902) and calculates a hash for each cycle-length substring of data in the frame (block 903). The mechanism then writes each substring of data using the hash as an address to a corresponding dictionary memory (block 904). For a two-cycle frame where each cycle is N bytes, the mechanism writes one N-byte substring to each of N dictionary memories.

The mechanism reads substrings of data from all dictionary memories using all of the calculated hashes as addresses (block 905). In block 905, the mechanism performs N reads from N dictionary memories, although many of the reads may result in invalid data. Then, the mechanism compares each substring to the read data from the corresponding dictionary memory (block 906) and selects the longest match of consecutive bytes starting at the first byte of the substring (block 907). The mechanism then has one match from each dictionary memory for a total of N matches.

Thereafter, the mechanism selects a subset of the matches (block 908). The mechanism selects matches to cover as many of the 2N–1 bytes as possible. The mechanism may first select a match that crosses the cycle boundary and covers as much of the current cycle as possible. The mechanism may then select additional matches to cover more bytes of the current cycle. The mechanism then codes non-matching bytes as literals and codes the matches with length and distance information (block 909), where the length indicates the length in bytes of the match and the distance references a previous instance of the data in the data stream. Then, the mechanism performs bit/byte alignment (block 910).

The mechanism then determines whether the current cycle is the last cycle (block 911). If the current cycle is not the last cycle in the data stream, the mechanism considers the next cycle of data in the data stream (block 912), and operation returns to block 901 to convert the data into a two-cycle frame. Operation then repeats for the next cycle. If the current cycle is the last cycle of data in the data stream in block 911, operation ends (block 913).

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for high bandwidth compression to encoded data streams. The mechanisms process data in continuous cycles resulting in low latency and high throughput. For an N-byte cycle of data, the mechanism uses N dictionary memories that perform N reads and one write for each byte offset in the N byte data. Several stages require a result be immediately available for the next cycle for use in the same stage.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for pipelined compression of multi-byte frames, the method comprising:
    combining a current cycle of data in an input data stream with at least a portion of a next cycle of data in the input data stream to form a frame of data;
    identifying a plurality of matches in a plurality of dictionary memories, wherein each match matches a portion of a given substring in the frame of data;
    identifying a subset of matches from the plurality of matches that provides a best coverage of the current cycle of data; and
    encoding the frame of data into an encoded output data stream.

2. The method of claim 1, wherein combining the current cycle of data with at least the portion of the next cycle of data comprises forming a plurality of substrings, each starting at a respective byte of the current cycle of data and having a length equal to the current cycle of data.

3. The method of claim 1, wherein the subset of matches crosses a cycle boundary between the first cycle of data and the next cycle of data.

4. The method of claim 1, wherein encoding the frame of data into the encoded output data, stream comprises:
    encoding each of the subset of matches with length and distance information to form match encoded data;
    encoding unmatched data in the current cycle of data in the input data stream using lossless compression to form compression encoded data; and
    aligning the match encoded data and the compression encoded data in an output data stream.

5. The method of claim 1, further comprising:
    generating an address based on each given substring in the plurality of substrings to form a plurality of addresses.

6. The method of claim 5, wherein generating the address comprises performing a hash on the given substring.

7. The method of claim 5, further comprising:
writing each given substring and a corresponding position value to a corresponding dictionary memory within the plurality of dictionary memories using the address generated from the given substring.

8. The method of claim 5, wherein identifying the plurality of matches comprises:
using the plurality of addresses to read from each given dictionary memory within the plurality of dictionary memories to receive zero or more valid entries for each dictionary memory.

9. The method of claim 8, wherein identifying the plurality of matches further comprises:
for each dictionary memory having at least one valid entry, comparing the at least one valid entry to a corresponding substring; and
for each dictionary memory having at least one valid entry, selecting a longest match based on a number of consecutive matching bytes starting from a beginning of the corresponding substring to form the plurality of matches.

10. The method of claim 9, wherein each of the plurality of matches has a match length value and a position value, wherein the length value indicates a length of the matching data and the position value references a previous occurrence of the matching data in the input data stream.

11. An apparatus for high bandwidth compression to an encoded data stream, the apparatus comprising:
a dictionary lookup/update stage comprising a plurality of dictionary memories and associated logic;
a match selection stage comprising a plurality of compare circuits and associated logic; and
an encoding stage,
wherein the dictionary lookup/update stage receives a frame of data comprising a current cycle of data in an input data stream combined with at least a portion of a next cycle of data in the input data stream and identifies a plurality of matches in the plurality of dictionary memories, wherein each match matches a portion of a given substring in the plurality of substrings;
wherein the match selection stage identifies a subset of matches from the plurality of matches that provides a best coverage of the current cycle of data using the plurality of compare circuits; and
wherein the encoding stage encodes the frame of data into an encoded output data stream.

12. The apparatus of claim 11, wherein combining the current cycle of data with at least the portion of the next cycle of data comprises forming a plurality of substrings, each starting at a respective byte of the current cycle of data and having a length equal to the current cycle of data.

13. The apparatus of claim 11, wherein the subset of matches crosses a cycle boundary between the first cycle of data and the next cycle of data.

14. The apparatus of claim 11, wherein the encoding stage encodes each of the subset of matches with length and distance information to form match encoded data and encodes unmatched data in the current cycle of data in the input data stream using lossless compression to form compression encoded data.

15. The apparatus of claim 14, wherein the encoding stage comprises a Huffman coding circuit and wherein the encoding stage encodes unmatched data using the Huffman coding circuit.

16. The apparatus of claim 11, further comprising:
a bit/byte alignment stage, wherein the bit/byte alignment stage aligns the match encoded data and the compression encoded data in an output data stream.

17. The apparatus of claim 11, wherein the dictionary lookup/update stage generates an address based on each given substring in the plurality of substrings to form a plurality of addresses.

18. The apparatus of claim 17, wherein the dictionary lookup/update stage generates the address by performing a hash on the given substring.

19. The apparatus of claim 17, wherein the dictionary lookup/update stage writes each given substring and a corresponding position value to a corresponding dictionary memory within the plurality of dictionary memories using the address generated from the given substring.

20. The apparatus of claim 17, wherein the dictionary lookup/update stage identifies the plurality of matches by using the plurality of addresses to read from each given dictionary memory within the plurality of dictionary memories to receive zero or more valid entries for each dictionary memory.

21. The apparatus of claim 20, wherein the match selection stage identifies a subset of matches by, for each dictionary memory having at least one valid entry, comparing the at least one valid entry to a corresponding substring, and for each dictionary memory having at least one valid entry, selecting a longest match based on a number of consecutive matching bytes starting from a beginning of the corresponding substring to form the plurality of matches.

22. The apparatus of claim 21, wherein each of the plurality of matches has a match length value and a position value, wherein the length value indicates a length of the matching data and the position value references a previous occurrence of the matching data in the input data stream.

23. A computer program product comprising a computer readable storage medium having a computer readable program stored therein, wherein the computer readable program, when executed on a computing device, causes the computing device to:
combine a current cycle of data in an input data stream with at least a portion of a next cycle of data in the input data stream to form a frame of data;
identify a plurality of matches in a plurality of dictionary memories, wherein each match matches a portion of a given substring in the frame of data;
identify a subset of matches from the plurality of matches that provides a best coverage of the current cycle of data; and
encode the frame of data into an encoded output data stream.

24. The computer program product of claim 23, wherein combining the current cycle of data with at least the portion of the next cycle of data comprises forming a plurality of substrings, each starting at a respective byte of the current cycle of data and having a length equal to to the current cycle of data.

25. The computer program product of claim 23, wherein the subset of matches crosses a cycle boundary between the first cycle of data and the next cycle of data.

26. The computer program product of claim 23, wherein encoding the frame of data into the encoded output data stream comprises:
encoding each of the subset of matches with length and distance information to form match encoded data;

encoding unmatched data in the current cycle of data in the input data stream using lossless compression to form compression encoded data; and aligning the match encoded data and the compression encoded data in an output data stream.

27. The computer program product of claim 23, wherein the computer readable program further causes the computing device to:

generating an address based on each given substring in the plurality of substrings to form a plurality of addresses.

28. The computer program product of claim 27, wherein generating the address comprises performing a hash on the given substring.

29. The computer program product of claim 27, wherein the computer readable program further causes the computing device to:

writing each given substring and a corresponding position value to a corresponding dictionary memory within the plurality of dictionary memories using the address generated from the given substring.

30. The computer program product of claim 27, wherein identifying the plurality of matches comprises:

using the plurality of addresses to read from each given dictionary memory within the plurality of dictionary memories to receive zero or more valid entries for each dictionary memory.

31. The computer program product of claim 30, wherein identifying the plurality of matches further comprises:

for each dictionary memory having at least one valid entry, comparing the at least one valid entry to a corresponding substring; and for each dictionary memory having at least one valid entry, selecting a longest match based on a number of consecutive matching bytes starting from a beginning of the corresponding substring to form the plurality of matches.

32. The computer program product of claim 31, wherein each of the plurality of matches has a match length value and a position value, wherein the length value indicates a length of the matching data and the position value references a previous occurrence of the matching data in the input data stream.

* * * * *